(12) United States Patent
Oka

(10) Patent No.: US 9,768,228 B2
(45) Date of Patent: Sep. 19, 2017

(54) SEMICONDUCTOR DEVICE AND METHOD FOR MANUFACTURING THE SAME

(71) Applicant: NICHIA CORPORATION, Anan-shi (JP)

(72) Inventor: Yuta Oka, Tokushima (JP)

(73) Assignee: NICHIA CORPORATION, Anan-Shi (JP)

(*) Notice: Subject to any disclaimer, the term of this patent is extended or adjusted under 35 U.S.C. 154(b) by 34 days.

(21) Appl. No.: 14/140,352

(22) Filed: Dec. 24, 2013

(65) Prior Publication Data

US 2014/0175595 A1 Jun. 26, 2014

(30) Foreign Application Priority Data

Dec. 26, 2012 (JP) .................................. 2012-283270
Nov. 13, 2013 (JP) .................................. 2013-235228

(51) Int. Cl.
*H01L 27/16* (2006.01)
*H01L 27/02* (2006.01)
(Continued)

(52) U.S. Cl.
CPC .......... *H01L 27/16* (2013.01); *H01L 25/0753* (2013.01); *H01L 27/0207* (2013.01); *H01L 33/60* (2013.01); *H01L 33/62* (2013.01); *H01L 2224/32225* (2013.01); *H01L 2224/45144* (2013.01); *H01L 2224/48137* (2013.01); *H01L 2224/48227* (2013.01);
(Continued)

(58) Field of Classification Search
None
See application file for complete search history.

(56) References Cited

U.S. PATENT DOCUMENTS 7,655,957 B2 2/2010 Loh et al.
8,378,374 B2 2/2013 Loh et al.
(Continued)

FOREIGN PATENT DOCUMENTS

JP 2009-521077 A 5/2009
JP 2011-216868 A 10/2011
(Continued)

*Primary Examiner* — Abul Kalam
(74) *Attorney, Agent, or Firm* — Foley & Lardner LLP

(57) ABSTRACT

The present invention relates to a semiconductor device, including: a substrate; a plurality of first semiconductor elements and a second semiconductor element arranged on a mount area of the substrate; an external electrode to supply electricity to the first and second semiconductor elements; and a frame of reflective material formed at a periphery of the mount area. Extensions of the first external electrodes are formed at the inner side of the plurality of wirings, and the first external electrodes are formed along the periphery of the mount area at the outer side of at least one of the second external electrodes or the wiring connected to the second external electrodes, and electrodes of the plurality of first semiconductor elements are electrically connected to the pair of first external electrodes by a bonding wire that bridges across at least one of the pair of the second external electrodes or the wiring electrically connected to the pair of second external electrodes with intervening a part of the frame therebetween.

27 Claims, 5 Drawing Sheets

(51) Int. Cl.
*H01L 25/075* (2006.01)
*H01L 33/62* (2010.01)
*H01L 33/60* (2010.01)

(52) U.S. Cl.
CPC ............... *H01L 2224/48644* (2013.01); *H01L 2224/83801* (2013.01); *H01L 2224/83851* (2013.01); *H01L 2224/8592* (2013.01); *H01L 2224/85444* (2013.01); *H01L 2924/00011* (2013.01)

(56) References Cited

U.S. PATENT DOCUMENTS

| | | | |
|---|---|---|---|
| 9,123,560 B2* | 9/2015 | Lee | H01L 25/0753 |
| 2007/0253209 A1 | 11/2007 | Loh et al. | |
| 2008/0121902 A1* | 5/2008 | Sackrison | H01L 25/0756 257/89 |
| 2009/0080184 A1* | 3/2009 | Kobilke | H01L 25/0753 362/227 |
| 2009/0206758 A1 | 8/2009 | Kobilke | |
| 2010/0109029 A1 | 5/2010 | Loh et al. | |
| 2010/0140634 A1* | 6/2010 | van de Ven | H01L 25/0753 257/88 |
| 2011/0116252 A1* | 5/2011 | Agatani | F21K 9/00 362/84 |
| 2011/0222264 A1 | 9/2011 | Matsuda et al. | |
| 2012/0007112 A1* | 1/2012 | Yamada | H01L 33/60 257/88 |
| 2013/0193862 A1* | 8/2013 | Sasano | H01L 25/0753 315/192 |
| 2014/0098529 A1* | 4/2014 | Hata | F21V 23/001 362/231 |
| 2014/0197431 A1* | 7/2014 | Oka | H01L 25/0753 257/88 |

FOREIGN PATENT DOCUMENTS

| | | | |
|---|---|---|---|
| JP | 2012-099572 A | 5/2012 | |
| JP | 2012-109637 A | 6/2012 | |
| JP | WO2012/165007 A1 * | 12/2012 | ............ H01L 33/50 |
| JP | 2013-179197 A | 9/2013 | |

* cited by examiner

SEMICONDUCTOR DEVICE AND METHOD FOR MANUFACTURING THE SAME

BACKGROUND OF THE INVENTION

Field of the Invention

The present invention relates to a semiconductor device on which a plurality of semiconductor elements are mounted, and to a method for manufacturing the same.

Description of the Related Art

In recent years, as a variety of electronic components have been proposed and put into practice, higher and higher performance has been required for these devices. For example, the same goes for light emitting devices such as light emitting diodes (LEDs). In the fields of general lighting, on-vehicle lighting and the like, the required performance has been getting higher and higher, and there is a need for higher output (higher brightness) and higher reliability. Furthermore, there is also a need for low prices while satisfying these properties.

For example, a chip on board (COB) structure is known in the art, in which a plurality of light emitting elements are mounted on a mount area of a flat substrate, electrodes of the light emitting elements are electrically connected to external electrodes by bonding wires or the like, and the mount area is sealed with a translucent resin covering the light emitting elements and bonding wires.

For example, JP 2011-216868A discloses a light emitting device in which a plurality blue LED elements and a plurality of red LED elements are sealed with a phosphor-containing translucent resin. These blue LED elements and red LED elements are electrically connected to each other in series to form a plurality of series circuits, and the electrodes of the LED elements at both ends of each series circuit are electrically connected to a pair of external electrodes by bonding wires.

In the light emitting device of JP 2011-216868A, since the blue LED elements (hereinafter referred to as blue light emitting elements) and the red LED elements (hereinafter referred to as red light emitting elements) are electrically connected to each other in series, lighting control of these blue light emitting elements and red light emitting elements can be carried out by a single control system, which allows for simplification of its control system. However, for the purpose of achieving better color rendering properties, there is a need for a capability of separately controlling the brightness of the blue light emitting elements and the brightness of the red light emitting elements by separately controlling lighting of the blue light emitting elements and lighting of the red light emitting elements. However, separate control of the blue light emitting elements and the red light emitting elements requires separate control systems and additional external electrodes. Furthermore, the increasing number of the bonding wires from the light emitting elements to the external electrodes results in close spacing thereof. Such close spacing of the bonding wires may cause contact between the bonding wires of the blue light emitting elements and the red light emitting elements to cause deterioration of the insulation between them. Furthermore, if the external wirings are made of light-absorbing material, the optical output may be degraded.

In particular, if a plurality of light emitting elements or protection elements to be mounted on a substrate have a back-face electrode, it is required to provide a wiring to be connected to the back-face electrodes of the semiconductor elements on the mount area of the substrate. Therefore, the semiconductor elements placed at the center of the mount area require a complicated wiring pattern in the center area of the mount area. Furthermore, the insulation may deteriorate due to contact with bonding wires that are connected to the electrodes on the upper faces of the semiconductor elements. On the other hand, if the light emitting elements each have a plurality of bonding pads on the upper face, the increasing number of bonding wires may further increase the risk of deterioration of the insulation due to contact between the bonding wires.

SUMMARY OF THE INVENTION

The present invention has been made in light of the above problems, and an object thereof is to provide a semiconductor device in which degradation of the performance is prevented by ensuring electric insulation of bonding wires that connect a plurality of semiconductor elements to external electrodes, and a method for manufacturing the same.

To solve the above problems, a semiconductor device of the present invention include: a substrate; a plurality of first semiconductor elements and second semiconductor elements arranged on a mount area of the substrate; an external electrode that is formed on the substrate to supply electricity to the first and second semiconductor elements; and a frame of reflective material formed at a periphery of the mount area, wherein the external electrode includes a pair of positive and negative first external electrodes connected to the plurality of first semiconductor elements and a pair of positive and negative second external electrodes connected to the second semiconductor element, the pair of first external electrodes are placed along the periphery of the mount area at an outer side of at least one of the pair of the second external electrodes or a wiring electrically connected to the pair of second external electrodes, and electrodes of the plurality of first semiconductor elements are electrically connected to the pair of first external electrodes by a bonding wire that bridges across at least one of the pair of the second external electrodes or the wiring electrically connected to the pair of second external electrodes, and a part of the frame is interposed between the bonding wire and at least one of the pair of the second external electrodes or the wiring electrically connected to the pair of second external electrodes.

Further, another semiconductor device of the present invention includes: a substrate; a plurality of first semiconductor elements and a second semiconductor element arranged on a mount area of the substrate; an external electrode that is formed on the substrate to supply electricity to the first and second semiconductor elements; and a frame of reflective material formed at a periphery of the mount area, wherein the external electrode includes a pair of positive and negative first external electrodes connected to the plurality of first semiconductor elements and a pair of positive and negative second external electrodes connected to the second semiconductor element, wherein the pair of first external electrodes and the pair of the second external electrodes each includes a terminal to be connected to an external electrode and an extension extending from the terminal along the periphery of the mount area, the semiconductor device further includes a plurality of wirings are formed on the substrate along the extensions of the pair of the first external electrodes, and the extensions of the pair of first external electrodes and pair of second external electrodes and the plurality of wirings are covered with the frame.

Further, a method for manufacturing the semiconductor device of the present invention includes the steps of: preparing the substrate on which the mount area, the pair of positive and negative first external electrodes and the pair of second positive and negative external electrodes are formed, wherein the pair of first external electrodes are formed along the periphery of the mount area at an outer side of at least one of the pair of the second external electrodes or the wiring connected to the pair of second external electrodes; mounting the plurality of first semiconductor elements and at least one of the second semiconductor element on the mount area; electrically connecting the element electrodes of the first semiconductor elements to the pair of first external electrodes by the bonding wire that bridges across at least one of the pair of second external electrodes or the wiring connected to the pair of second external electrodes; and forming the frame around the mount area such that a part of the frame is interposed between the bonding wire and at least one of the pair of the second external electrodes or the wiring connected to the pair of second external electrodes.

With the present invention, it becomes possible to reduce degradation of the performance of semiconductor devices by ensuring electric insulation of their bonding wire.

DETAILED DESCRIPTION OF THE EMBODIMENT

A semiconductor device and a manufacturing method thereof according to embodiments of the present invention will be described below with reference to the accompanying drawings.
(Semiconductor Device)

A light emitting device 100 that employs semiconductor light emitting elements as its semiconductor elements, which is an example of a semiconductor device according to an embodiment of the present invention, will be described in detail with reference to FIGS. 1 through 5. The top view of FIG. 1 illustrates the state before a frame is formed, and the top view of FIG. 2 illustrates the state after the frame is formed.

Figure 1:
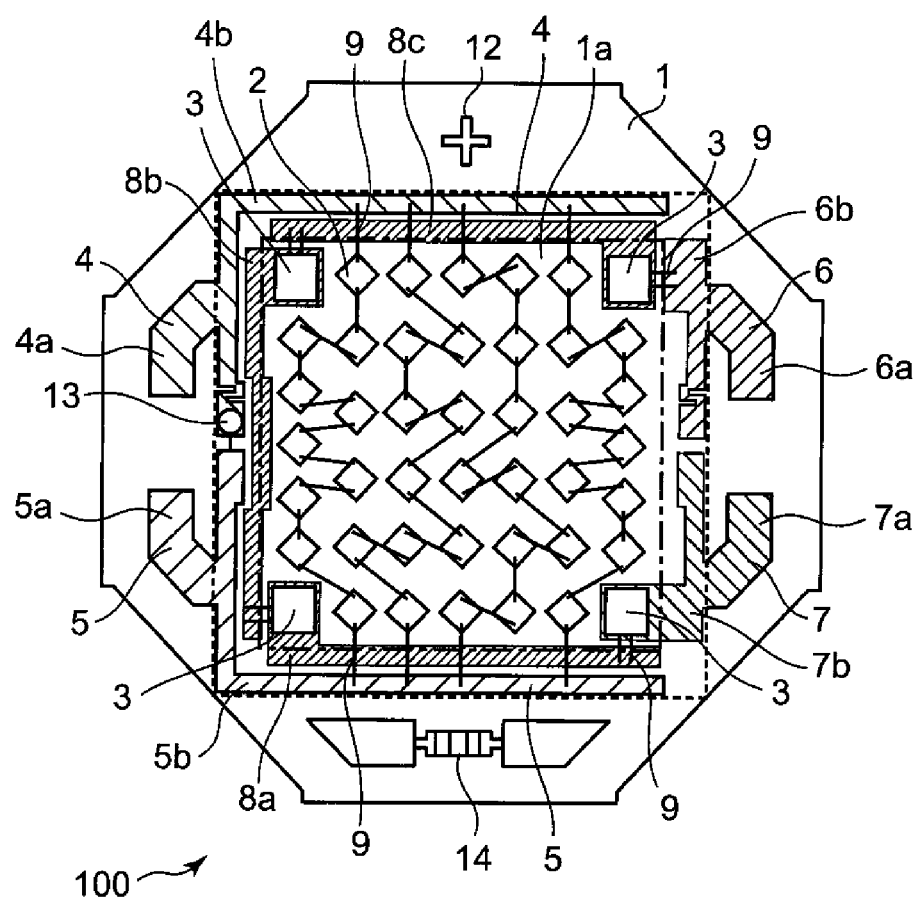
FIG. 1 is a top view illustrating the structure of a semiconductor device according to an embodiment of the present invention, in a state before a frame and a sealing member are formed.
Figure 2:
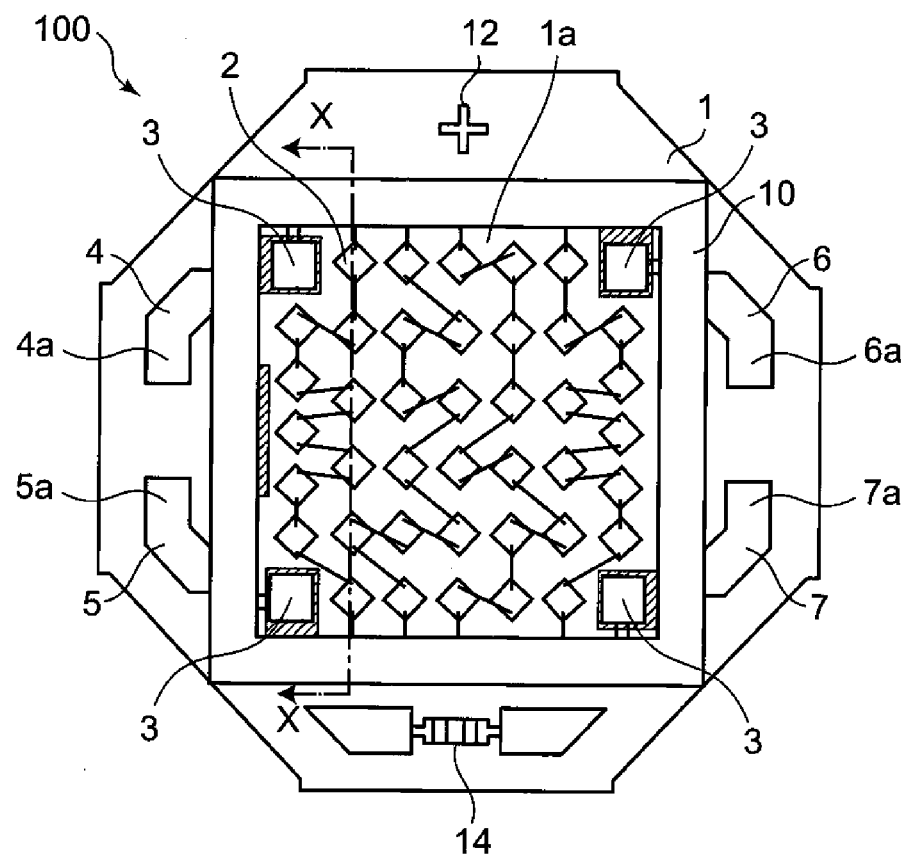
FIG. 2 is a top view illustrating the structure of the semiconductor device according to the embodiment of the present invention, in a state before the sealing member is formed.

As illustrate in FIGS. 1 and 2, the light emitting device 100 includes a substrate 1, a plurality of first light emitting elements 2 and a plurality of second light emitting elements 3 both of which are arranged on a mount area 1a of the substrate 1, a pair of first external electrodes 4 and 5 formed on the substrate 1 to supply electricity to the first light emitting elements 2, a pair of second external electrodes 6 and 7 formed on the base 1 to supply electricity to the second light emitting elements 3, and a frame 10 of reflective material formed around the mount area 1a. The members denoted by reference signs 8a, 8b and 8c are relay wirings for the pair of second external electrodes that relay electricity to the plurality of light emitting elements 3 by connecting them to each other. The member denoted by reference sign 12 is an anode mark to indicate that the first external electrode 4 and the second external electrode 6 are positive electrodes, and the first external electrode 5 and the second external electrode 7 are negative electrodes. Further, in the example of the figure, a protection element 13 is provided on the first external electrode 4, and a thermistor (thermal sensor) 14 is provided on the substrate 1.

The first external electrode 4 includes a terminal 4a and an extension 4b that extends from the terminal 4a along the periphery of the mount area 1a, and the first external electrode 5 includes a terminal 5a and an extension 5b that extends from the terminal 5a along the periphery of the mount area 1a. Similarly, the second external electrode 6 includes a terminal 6a and an extension 6b that extends from the terminal 6a along the periphery of the mount area 1a, and the second external electrode 7 includes a terminal 7a and an extension 7b that extends from the terminal 7a along the periphery of the mount area 1a. The relay wirings 8a, 8b and 8c are formed extending along the extensions 4b and 5b. The extensions 4b, 5b, 6b and 7b and the relay wirings 8a, 8b and 8c are covered with the frame 10.
(Substrate)

The substrate 1 is a substrate for mounting semiconductor elements such as the light emitting elements 2 and 3 and the protection element 13. The substrate 1 may has any shape as long as a plurality of semiconductor elements can be mounted thereon. For example, it may have a rectangular, circular or oval shape. Further, the substrate 1 may have any size, and the size may be suitably set according to the purpose or intended use such as the number of the semiconductor elements.

The substrate 1 is preferably made of material that is insulative as well as less translucent to light emitted from the light emitting elements and external light. It is also preferred that the material has a certain level of the strength. Specifically, such materials include ceramics ($Al_2O_3$, AlN and the like) and resins such as a phenol resin, an epoxy resin, a polyimide resin, a bismaleimide triazine resin (BT resin) and polyphthalamide (PPA). Alternatively, the substrate may be a composite substrate that is composed of a metal base having a high thermal conductivity such as aluminum and an insulation layer laminated on the surface thereof.
(Mount Area)

The mount area 1a is an area to which the plurality of light emitting elements 2 and 3 are placed. The mount area 1a corresponds to the rectangular area surrounded by the dot-dash line in FIG. 1, and is defined in the center area of the substrate 1. In the area between the dot-dash line and the outer dot line, the frame 10 mentioned below is placed. The mount area 1a may have any size and shape, and the size and shape may be suitably set according to the purpose or intended use such as the number and spacing of the light emitting elements.

On the surface of the mount area 1a, a metal film with a predetermined pattern (not shown) may be formed, on which the plurality of light emitting elements may be placed. The metal film provided on the surface of the mount area 1a can reflect light that emerges from the light emitting elements toward the mount area 1a of the substrate 1. Therefore, a loss of the emitted light can be reduced, which results in improved light extraction efficiency of the light emitting device. If the substrate is made of material having a high reflectivity such as alumina, the metal film is not required.

The metal film may be formed by electrolytic plating. The metal film may be made of any material as long as it can be made by plating. For example, it may be made of Au (gold). While Au highly absorbs light, its light reflectivity can be enhanced, for example, by further forming a $TiO_2$ film on the surface of the plated Au. It is preferred that the metal film is made of material that has a reflectivity to light of the light emitting elements higher than the reflectivity of the metal material of the external electrodes mentioned below. For example, it is preferred that the external electrodes are made of Au while the metal film is made of Ag. Since Ag has a higher light reflectivity than Au, it can improve the light extraction efficiency. The metal film formed on the mount area 1a may have any thickness, and the thickness may be suitably set according to the purpose or intended use.

(Semiconductor Elements)

The semiconductor elements include the light emitting elements, a transistor to control the light emitting elements, the protection element and the like. The first semiconductor elements 2 and the second semiconductor elements 3 of FIG. 1 are light emitting elements that emit light by application of a voltage. As illustrated in FIG. 1, a plurality of the light emitting elements 2 and 3 are placed on the mount area 1a of the substrate 1. While there are four pieces of light emitting elements 2 in FIG. 1, the number of the light emitting elements 2 is not particularly limited as long as there is one or more light emitting element 2.

As the light emitting elements of the present invention, the device includes at least elements (light emitting elements 3 in FIG. 1) that have a back-face electrode and a front-face electrode with different polarities and elements (light emitting elements 2 in FIG. 1) that have a pair of element electrodes (p-electrode and n-electrode) on the same face and are compatible with face-up mounting. Alternatively, all of the elements may have a pair of element electrodes (p-electrode and n-electrode) on the same face. Their back-face electrodes are joined to the metal film (wiring) in the mount area of the substrate by a conductive joining member (e.g. conductive adhesive or solder paste). Meanwhile, in face-up mounting, their back faces are joined to the mount area by an adhesive.

The light emitting elements are preferably light emitting diodes, whose emission wavelength may be suitably selected according to the intended use. For example, blue (light at a wavelength of from 430 nm to 490 nm) and green (light at a wavelength of from 490 nm to 570 nm) light emitting elements may be those made of ZnSe, a nitride semiconductor ($In_XAl_YGa_{1-X-Y}N$, $0 \leq X$, $0 \leq Y$, $X+Y \leq 1$), GaP or the like. Red (light at a wavelength of from 620 to 750 nm) light emitting elements are preferably those made of GaAlAs, AlInGaP or the like.

If a phosphor is introduced to the sealing member as mentioned below, it is preferred to employ nitride semiconductors ($In_XAl_YGa_{1-X-Y}N$, $0 \leq X$, $0 \leq Y$, $X+Y \leq 1$), which can emit short-wavelength light that can effectively excite the phosphor. However, the composition, emission color, size and the like of the light emitting elements are not limited to the above-mentioned characteristics, and may be suitably selected according to the intended use. Besides visible light, the light emitting elements 2 may also be elements that output ultraviolet or infrared ray.

The light emitting elements 2 and 3 having different emission colors may be arranged in a matrix on the mount area 1a. The light emitting elements 3 may be placed at the marginal part of the mount area. For example, it is preferred that four pieces of them are placed respectively at the four corners of the rectangular mount area 1a as illustrated in FIG. 1. This arrangement can shorten the connection distance to the second external electrodes mentioned below. Meanwhile, the light emitting elements 2 may be arranged in rows and columns on the remaining space of the mount area 1a other than the areas for the light emitting elements 3 at the marginal part. In FIG. 1, the plurality of light emitting elements 2 are arranged in seven rows, where six pieces each in the rows on both sides and five pieces each in the other middle rows bring the total to 40 pieces. By arranging the plurality of light emitting elements 2 such that the elements located on the third and fourth lines are shifted by a half pitch in the row direction, these 40 pieces of the light emitting elements 2 are efficiently arranged in the mount area.

In FIG. 1, the light emitting elements 3 at the four corners have a back-face electrode and an upper electrode, in which the back-face electrode and the upper electrode respectively correspond to their n-electrode and p-electrode, and two bonding wires are drawn out of the p-electrode. Two bonding wires are drawn because they make it easier to distribute electric current all over the light emitting elements having a comparatively large electrode area. Accordingly, if the light emitting elements are comparatively small and have a comparatively small electrode, they may have only one bonding wire. The four light emitting elements 3 respectively placed at the four corners of the mount area are connected to each other in series by the second external electrode 7, the relay wirings 8a, 8b and 8c and the second external electrode 6. Meanwhile, the light emitting elements 2 are face-up mounted on the mount area, and may be connected to the first external electrodes such that a set of light emitting elements 2 are connected to each other in series to form an element group, and a plurality of the element groups are connected to the first external electrodes in parallel. For example, four rows of element groups, each of which is composed of 10 pieces of the light emitting elements 2 connected in series, may be connected to the first external electrode 4 in parallel as illustrated in FIG. 1. As used herein, the term "being connected in series" means that the p-electrode of a light emitting elements 2 is electrically connected to the n-electrode of an adjacent light emitting element 2 by a bonding wire. Further, the term "being connected in parallel" means that a plural sets of element groups of serially-connected light emitting elements are connected to the first external electrodes such that the p-electrode of a light emitting element 2 at one end of each element group is electrically connected to one of the first external electrodes and the n-electrode of a light emitting element 2 at the other end is electrically connected to the other of the first external electrodes.

It is preferred that each of the four element groups includes the same number of the serially-connected light emitting elements 2. This is because, since the light emitting elements 2 are connected to the first external electrodes as parallel-connected rows so that an equal voltage is applied, difference of the number of the light emitting elements 2 among the rows causes uneven light emission due to difference of the voltage applied to individual the light emitting elements 2, which results in uneven brightness in the light emitting face.

The light emitting elements 2 and 3 may be any element as long as they have different emission colors from each other. For example, the light emitting elements 2 may be blue light emitting elements, while the light emitting elements 3 may be red light emitting elements. Alternatively, the light emitting elements 2 may be red light emitting elements, while the light emitting elements 3 may be blue light emitting elements.

(External Electrodes)

The external electrodes are conductive members that serve as positive and negative electrodes, and electrically connect the electronic components on the substrate such as the plurality of light emitting elements and the protection element to an outer power supply so as to supply electricity from the outer power source to these electronic components. The conductive members of the external electrodes may have any shape such as circular, rectangular, oval, strip, and linear shapes depending on the structure, arrangement and number of the electronic components to be connected and the like.

The present invention employs the pair of positive and negative first external electrodes to supply electricity to the first light emitting elements and the pair of positive and negative second external electrodes to supply electricity to the second light emitting elements, in which the pair of first external electrodes are located along the periphery of the mount area at the outer side of at least one of the pair of second external electrodes or a wiring that is electrically connected to the pair of second external electrodes. The first external electrodes may have any shape as long as they are formed along the periphery. The second external electrodes are formed such that at least one of the pair of the second external electrodes is located along the mount area at the inner side of the first external electrodes or is located at the outer side of the wiring that is electrically connected to the pair of the second external electrodes. As used herein, "the wiring that is electrically connected to the pair of the second external electrodes" is a conductive member that is not integral with the pair of second external electrodes and that electrically connects the positive and negative second external electrodes to each other. For example, it may be the relay wirings.

FIG. 1 illustrates the device that includes the pair of positive and negative first external electrodes 4 and 5 that supply electricity to the first light emitting electrodes and the pair of positive and negative second external electrodes 6 and 7 that supply electricity to the second light emitting electrodes. The first external electrode 4 is a positive electrode. The first external electrode 5 is a negative electrode. The second external electrode 6 is a positive electrode. The second external electrode 7 is a negative electrode. Further, the second external electrodes are provided with the relay wirings 8a, 8b and 8c that connect the plurality of light emitting elements 3 to each other to relay electricity. Along the periphery of the mount area, the first external electrodes are positioned at the outer side of the relay wirings 8a, 8b and 8c of the second external electrodes. More specifically, the extension 4b of the first external electrode 4 and the extension 5b of the first external electrode 5 are positioned at the outer side of the relay wirings 8a, 8b and 8c. The extensions 4b and 5b are connected to the terminal electrodes of the first light emitting elements by bonding wires that bridge across the relay wirings 8a, 8b and 8c. This structure can prevent complicated wiring arrangement while keeping a space for the mount area 1a.

In the example of FIG. 1, the mount area has a rectangular shape that has the first, second, third and fourth sides clockwise from the side with the second external electrodes 6 and 7, i.e. the right side in the figure. The second external electrodes 6 and 7 and the relay wirings 8a, 8b and 8c are placed around the four sides of the rectangular shape parallel to them. Specifically, the second external electrode 7 is parallel to the first side, the relay wiring 8a is parallel to the second side, the relay wiring 8b is parallel to the third side, the relay wiring 8c is parallel to the fourth side, and the second external electrode 6 is parallel to the first side. Further, the second external electrode 7 and the second external electrode 6 are spaced apart but are adjacent to each other.

The first external electrode 4 has an L-shaped portion, which is placed around the third and fourth sides at the outer side of the relay wirings 8b and 8c. The first external electrode 5 has an L-shaped portion, which is placed around the second and third sides at the outer side of the relay wirings 8a and 8b. One end of the first external electrode 4 and one end of the first external electrode 5 are spaced apart but are adjacent to each other along the circumference of the mount area 1a of FIG. 1, specifically around the third side. The protection element 13 electrically connected between the one end of the first external electrode 4 and the one end of the first external electrode 5 can prevent the voltage across these positive and negative electrodes from rising beyond the Zener voltage, so as to suitably prevent the light emitting elements from breakage or degradation of the performance due to application of an excessive voltage.

Each of the four corners of the mount area has one second light emitting element. The light emitting element placed at the corner defined by the first and second sides is electrically connected to the second external electrode 7, and the upper electrode thereof is electrically connected to the relay wiring 8a by bonding wires 9. The light emitting element placed at the corner defined by the second and third sides is electrically connected to the relay wiring 8a, and the upper electrode thereof is electrically connected to the relay wiring 8b by the bonding wires 9. The light emitting element placed at the corner defined by the third and fourth sides is electrically connected to the relay wiring 8b, and the upper electrode thereof is electrically connected to the relay wiring 8c by the bonding wires 9. The light emitting element placed at the corner defined by the fourth and first sides is electrically connected to the relay wiring 8c, and the upper electrode thereof is electrically connected to the second external electrode 6 by the bonding wires 9.

Meanwhile, the plural sets of element groups of a plurality of serially-connected light emitting elements 2 are connected such that the terminal electrodes of the light emitting elements at one ends of the element groups on the same side are electrically connected to the first external electrode 5 by the bonding wires 9 that bridge across the relay wiring 8a of the second external electrodes, and the terminal electrodes of the light emitting elements at the other ends of the element groups are electrically connected to the first external electrode 4 by the bonding wires 9 that bridge across the relay wiring 8c of the second external electrodes.

It is preferred that the external electrodes are made of Au. This is because if the bonding wires are made of Au as mentioned below, the external electrodes can be firmly joined with the bonding wires of the same material.

The external electrodes are formed by electroless plating. The thickness of the external electrodes is not particularly limited, and may be suitably set according to the purpose and intended use such as the number of the bonding wires.

Since a part of the frame mentioned below is interposed between the bonding wires that electrically connect the electrodes of the light emitting elements 2 to the first external electrodes and the underlying relay wirings of the second external electrodes, the bonding wires are well-insulated from the wirings. Further, even if the external electrodes are made of Au, which highly absorbs a part of light from the light emitting elements as mentioned above, the light emitted from the light emitting elements does not reach the wirings but is reflected on the frame. As a result, this can reduce a loss of the emission light, which results in improved light extraction efficiency of the light emitting device.

Furthermore, the part of the frame interposed between the bonding wires of the electrodes of the light emitting elements 2 and the relay wirings of the second external electrodes can protect the relay wirings from dusts, moisture, external force and the like.

In FIG. 1, the light emitting elements 3 each include the upper electrode and the back-face electrode, and the back-face electrodes are electrically connected to the relay wiring of the second external electrodes. However, the light emitting elements 2 may each have an upper electrode and a back-face electrode. In this case, a plurality of relay wirings of the first external electrodes are provided on the mount area, and the back-face electrodes of the light emitting elements 2 are connected to the plurality of relay wirings. The upper electrodes of the light emitting elements 2 are connected to the relay wirings of the respective adjacent light emitting elements 2 by bonding wires so as to form the rows of serially-connected light emitting element groups. The upper electrode of the light emitting element 2 at one end of each row may be electrically connected to the relay wiring of one of the first external electrodes, and the relay wiring of the light emitting element 2 at the other end of each row can be electrically connected to the relay wiring of the other of the first external electrodes.

In FIG. 1, the device employs the second external electrodes as well as the relay wirings. However, the device may employ only the second external electrodes. In this case, the second external electrodes may be made of conductive members that are shaped along the mount area. For example, they may be made of conductive members that have an L-shaped portion like the first external electrodes. In this case, as the light emitting elements 3, at least one element whose element electrodes (p-electrode and n-electrode) are on the same face for face-up mounting may be connected to the positive and negative second external electrodes in series by bonding wires.

Figure 3:
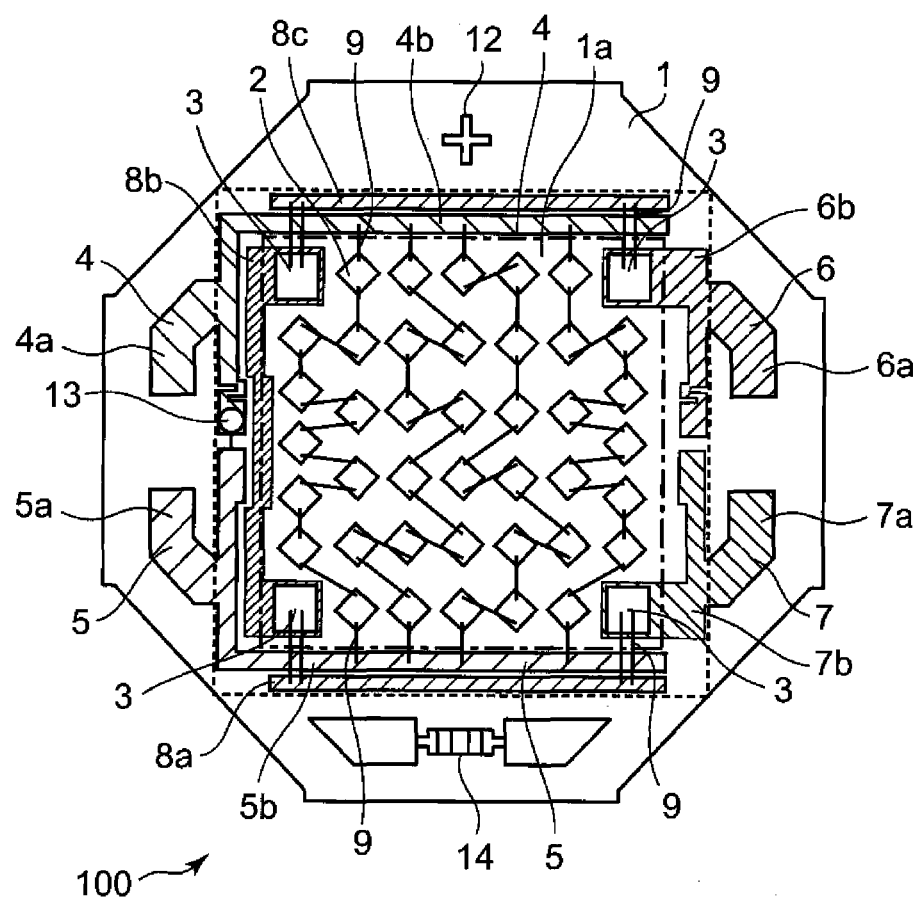
FIG. 3 is a top view illustrating the structure of another semiconductor device according to the embodiment of the present invention, in a state before a frame and a sealing member are formed.

Further, as illustrated in FIG. 3, the extensions of the first external electrodes may be positioned at the inner side of the plurality of wirings, and the bonding wires connecting the electrodes of the second semiconductor elements to the plurality of wirings may bridge across the extensions of the first external electrodes.

(Protection Element)

The protection element 13 protects the plurality of light emitting elements 2 from breakage or degradation of the performance due to application of an excessive voltage. The protection element is placed on an end of the first external electrode 4 as illustrated in FIG. 1, but it may be placed on an end of the first external electrode 5 instead. Further, in order to protect the light emitting elements 3, another protection element may be provided to the second external electrodes.

Specifically, the protection element is made of a Zener diode, which allows current to flow when the applied voltage is a specific voltage or more. The protection element is a semiconductor element with a p-electrode and an n-electrode as with the light emitting elements 2, and is electrically connected to the negative electrode 4 by a bonding wire in an antiparallel manner with respect to the p-electrodes and n-electrodes of the light emitting elements 2.

With this, even if an excessive voltage higher than the Zener voltage of the Zener diode is applied between the positive and negative electrodes of the first external electrodes (second external electrodes), the voltage across the positive and negative electrodes of the light emitting elements is maintained at the Zener voltage, and does not rise beyond the Zener voltage. As a result, the protection element can prevent the voltage across the positive and negative electrodes from going beyond the Zener voltage, which provides suitable prevention of the light emitting elements from breakage or degradation of the performance due to application of an excessive voltage.

By covering the protection element with the frame as illustrated in FIG. 2, the protection element as well as the bonding wire connected thereto can be protected from dust, moisture, external force and the like. The protection element may have any size, and the size may be suitably set according to the purpose and intended use.

(Other Electronic Components)

As necessary, electronic components other than the light emitting elements and protection element may be provided on the substrate. For example, the thermistor (thermal sensor) 14 is provided in FIG. 1. The thermistor (thermal sensor) is an electronic component that is placed on the substrate for monitoring temperature change of the semiconductor elements. It is preferred that the thermistor is placed at a position as close to the semiconductor elements as possible but not interfering with mounting of the semiconductor elements, for example, at an outer side of the frame 10 as illustrated in FIG. 1.

(Frame)

The frame 10 surrounds the circumference of the mount area 1*a* to define the mount area as well as is made of a light reflective member to reflect light emitted from the light emitting elements. A part of the frame 10 is interposed between the bonding wires electrically connecting the electrodes of the light emitting elements 2 to the first external electrodes and the relay wirings of the second external electrodes. The frame 10 is formed preferably such that a part of the frame is interposed between the bonding wires and the relay wirings of the second external electrodes while the frame covers all of the relay wirings of the first external electrodes and second external electrodes and the protection element. With this structure, the relay wirings and the bonding wires are insulated from each other by the insulation material of the frame. Furthermore, even if the relay wirings and bonding wires are made of Au, which highly absorbs light, light emitted from the light emitting elements does not reach the relay wirings and bonding wires but is reflected on the frame. As a result, this can reduce a loss of the emission light, which results in improved light extraction efficiency of the light emitting device. Furthermore, the wirings, the protection element and the like can be protected from dusts, moisture, external force and the like. It is required that the frame is tall enough so that the light emitting elements and bonding wires are completely buried and not exposed when the mount area is filled with the sealing member mentioned below.

As illustrated in FIG. 2, the frame may be formed in a rectangular frame shape surrounding the mount area 1*a* on the substrate 1, i.e. along the circumference of the mount area 1*a*. As the frame surrounds the circumference of the mount area 1*a*, it can reflect even light toward the circumference of the mount area 1*a*. As a result, a loss of the emission light can be reduced, which results in improved light extraction efficiency of the light emitting device.

Figure 5:
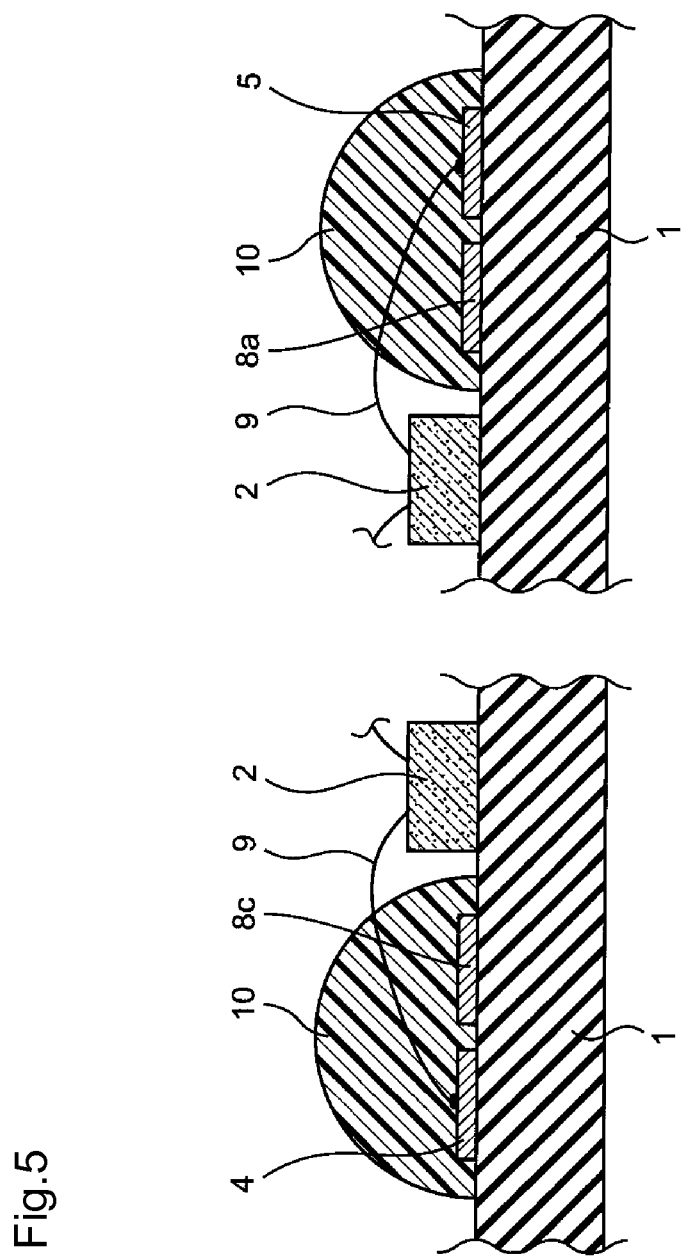
FIG. 5 is a cross sectional view taken along lines X-X of FIG. 2.

FIG. 5 is a schematic cross sectional view taken along lines X-X of FIG. 2. The frame 10 is formed such that a part of the frame is interposed between the bonding wires 9 connecting the first light emitting elements 2 to the first external electrode 4 and the relay wiring 8c. By virtue of the interposed frame 10, the bonding wires 9 do not come in direct contact with the relay wiring 8c.

Not only the functions of holding the resin of the sealing member and reflecting light, the frame also has a function of insulating the lead wirings from the bonding wires. Therefore, it is not required to employ another member for insulating the lead wirings from the bonding wires, which results in simplified structure of the light emitting device as well as an advantage of easier manufacture.

The frame is made of insulation material. Further, for a certain level of strength, it may be made of, for example, a thermosetting resin, a thermoplastic resin or the like. More specifically, such resins include a phenol resin, an epoxy resin, a BT resin, PPA, a silicone resin and the like. Further, in order to effectively reflect light, such base resins may be mixed with dispersed powder of a reflective member (e.g. $TiO_2$, $Al_2O_3$, $ZrO_2$ and MgO) or the like that absorbs less light from the light emitting elements and has a refractive index that is largely different from the refractive index of the base resins. The frame may have any size, and the size may be suitably set according to the purpose and intended use.

(Sealing Member)

Figure 4:
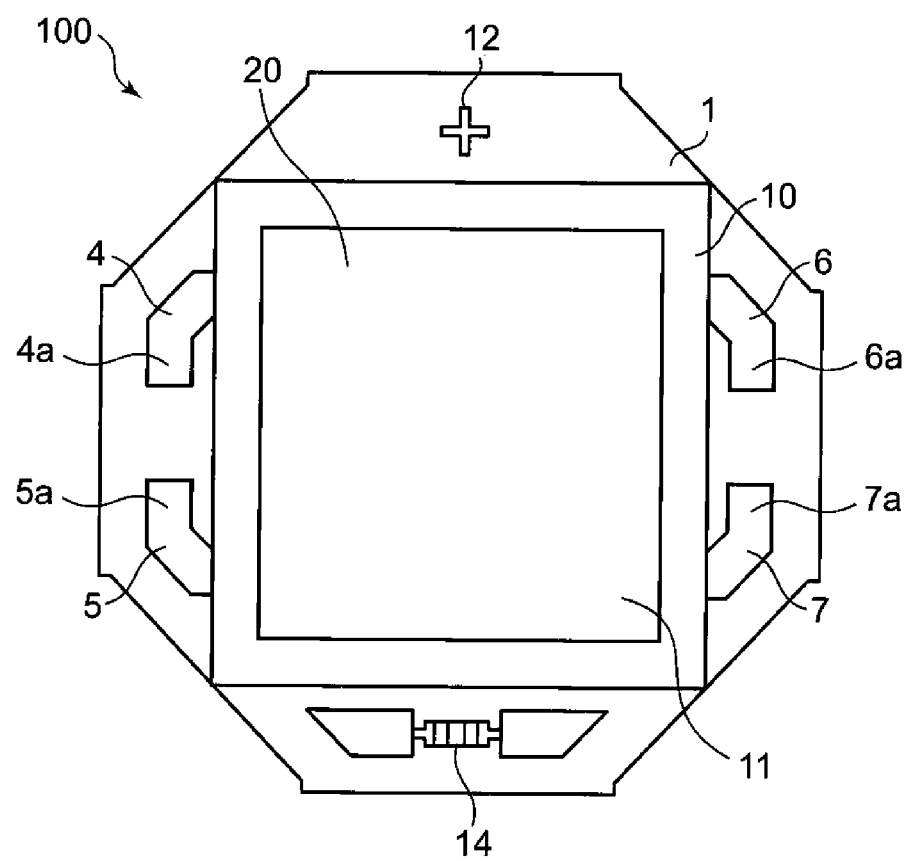
FIG. 4 is a top view illustrating an overall structure of the semiconductor device according to the embodiment of the present invention.

The sealing member 11 protects the light emitting elements and bonding wires on the substrate from dusts, moisture, external force and the like, and may be omitted according to need. As illustrated in FIG. 4, the sealing member 11 is formed on the substrate 1 by filling the inside of the frame 10, i.e. the mount area 1a surrounded by the frame 10 in FIG. 2, with a resin.

The sealing member 11 is preferably made of a material that is translucent to the light from the light emitting elements. Specifically, such materials include a silicone resin, an epoxy resin, a urea resin and the like. In addition to such materials, the sealing member may contain a colorant, a light diffuser, a filler, a phosphor or the like.

The sealing member 11 may be composed of a single member or of two or more plural layers. The sealing member 11 may be filled in any amount as long as it can cover the light emitting elements, bonding wires and the like that are placed in the mount area surrounded by the frame. To provide a lens function to the sealing member 11, the surface of the sealing member 11 may be raised to be formed in a bullet shape or a convex shape.

Instead of the sealing member, a dome cover may be placed around the frame on the substrate of the embodiment or on an external support (not shown) in order to protect the light emitting elements and bonding wires on the substrate from dusts, moisture, external force and the like. The dome cover may be made of at least one material selected from an epoxy resin, a polyimide resin, a polyamide resin, a fluorinated elastomer, glass, a hot melt-based material, a modified silicone, and an organic or inorganic hybrid resin. Such glass may be made of at least one material selected from soda glass, silica glass, borosilicate glass, oxynitride glass, and chalcogenide glass. Further, the material for pasting the dome cover to the substrate of the embodiment or an external support may be at least one selected from a brazing filler material (e.g. gold-tin alloy, copper-gold alloy, copper-silver alloy and the like), an epoxy resin, a polyimide resin, a polyamide resin, a fluorinated elastomer, glass, a hot melt-based material, a modified silicone, and an organic or inorganic hybrid resin. Alternatively, if the dome cover is made of low-melting glass, it may be fixed by welding the contact portion with the substrate or a support.

(Phosphor)

As a wavelength converting member, the sealing member 11 may contain a phosphor member that absorbs at least a part of light from the light emitting elements to emit light at a different wavelength. It is preferred that the phosphor member converts the wavelength of light from the light emitting elements to a longer wavelength. The phosphor member may be made of a single layer of a single phosphor material or the like, or of a single layer of a mixture of two or more phosphor materials or the like. Alternatively, the phosphor member may be made of a laminate of two or more layers of a single phosphor material or the like, or of a laminate of two or more layers of a mixture of two or more phosphor materials or the like. Specifically, exemplary materials of the phosphor member include, for example, YAG phosphors having a garnet structure including yttrium and aluminum, and nitride or oxynitride phosphors that are typically activated by a lanthanoid such as Eu and Ce.

Further, a phosphor may be placed apart from the light emitting elements. Being apart from the light emitting elements that serve as a heat source, the phosphor can be prevented from thermal degradation especially when it is less resistant to heat, which results in improved reliability of the semiconductor device. For example, a phosphor layer may be formed on the inner wall of the above-mentioned dome cover.

In addition to the phosphor layer on the inner wall of the dome cover, the sealing member of the embodiment may also contain a phosphor so that the device can output mixture light from the phosphors contained in these two members.

For example, yttrium aluminum garnet phosphors (YAG phosphors) are typical phosphors that can be suitably combined with blue light emitting elements to allow the device to emit white mixed light. To manufacture a light emitting device that can emit white light, the concentration of the phosphor in the phosphor layer can be adjusted. The concentration of the phosphor is, for example, from 5% to 50%.

Further, by using blue light emitting elements as the light emitting elements and using a YAG phosphor and a red-based nitride phosphor as the phosphors, it is also possible to allow the device to emit amber light. An amber color corresponds to those in a longer-wavelength part of the yellow range and a shorter-wavelength part of the yellowish red range in JIS Z8110 or corresponds to those in the range between the yellow range and the yellowish red short-wavelength range in JIS Z9101 on safety colors. For example, the dominant wavelength is in the range of from 580 nm to 600 nm.

YAG phosphor is a generic name for phosphors that have garnet structure containing Y and Al and are activated by at least one element selected from rare earth elements, which are excited by blue light emitted from a light emitting element to emit light. Examples of YAG phosphors include, for example, those having the general formula: $(Re_{1-x}Sm_x)_3(Al_{1-y}Ga_y)_5O_{12}$:Ce (where $0 \leq x < 1$, $0 \leq y \leq 1$, and Re is at least one element selected from the group consisting of Y, Gd and La).

Nitride phosphors are phosphors that contain: at least one group-II element selected from the group consisting of Be, Mg, Ca, Sr, Ba and Zn; at least one group-IV element selected from the group consisting of C, Si, Ge, Sn, Ti, Zr and Hf; and N, and are activated by at least one rare earth element selected from the group consisting of Y, La, Ce, Pr, Nd, Sm, Eu, Gd, Tb, Dy, Ho, Er and Lu. Such nitride phosphors may contain O in their composition.

Specifically, examples of such nitride phosphors include those having the general formula: $L_XM_YN_{((2/3)X+(4/3)Y)}$:R or $L_XM_YO_ZN_{((2/3)X+(4/3)Y-(2/3)Z)}$:R (where L is at least one group-II element selected from the group consisting of Be, Mg, Ca, Sr, Ba and Zn, M is at least one group-IV element selected from the group consisting of C, Si, Ge, Sn, Ti, Zr and Hf, R is at least one rare earth element selected from the group consisting of Y, La, Ce, Pr, Nd, Sm, Eu, Gd, Tb, Dy, Ho, Er and Lu, and X, Y and Z are respectively $0.5 \leq X \leq 3$, $1.5 \leq Y \leq 8$ and $0 < Z \leq 3$).

(Bonding Wires)

The bonding wires are conductive wires that electrically connect between the light emitting elements as well as the electronic components such as the light emitting elements and the protection element to the first external electrodes and the second external electrodes. Exemplary materials of the bonding wires include metals such as Au, Cu (copper), Pt (platinum) and Al (aluminum) and the alloys thereof. Au is particularly preferred because of its high thermal conductivity. The bonding wires may have any diameter, and the diameter may be suitably set according to the purpose and intended use.

A part of the frame is interposed between the bonding wires electrically connecting the electrodes of the light emitting elements 2 and the first external electrodes and the second external electrodes. Therefore, even if the bonding wires are made of Au, which highly absorbs light, light emitted from the light emitting elements is reflected on the frame without being absorbed by the bonding wires. As a result, a loss of the emission light can be reduced, which results in improved light extraction efficiency of the light emitting device. The light extracted from the light emitting device refers to the light extracted from the surface (light emitting face 20) of the sealing member 11 surrounded by the frame 10 as illustrated in FIG. 3.

(Operation of Light Emitting Device)

When the above-mentioned light emitting device is in operation, lights emerge from the light emitting elements in every direction. Among these lights, the light in an upward direction is extracted upward out of the light emitting device. Further, the lights in downward, lateral directions and the like are reflected on the bottom and side faces of the mount area of the substrate to be extracted upward out of the light emitting device. Since the light reflective frame is formed around the mount area, the lights are prevented from being absorbed and are reflected by the frame. As a result, the lights from the light emitting elements are effectively extracted.

(Method for Manufacturing Semiconductor Device)

An exemplary method for manufacturing a semiconductor device according to the embodiment of the present invention will be described below with reference to the accompanying drawings. While a substrate 1 is used in the following method, the manufacturing method may also be carried out using a collective substrate in which substrates 1 are arrayed in the plane direction, and it may be cut and divided into individual substrates 1 in the last step.

The method for manufacturing the semiconductor device of the present invention includes at least the following steps of: preparing a substrate that is provided with a mount area, a pair of positive and negative first external electrodes and a pair of positive and negative second external electrodes on a surface, wherein the pair of first external electrodes are placed along the periphery of the mount area at an outer side of at least one of the pair of second external electrodes or an wiring electrically connected to the pair of second external electrodes; mounting a plurality of first semiconductor elements and at least one second semiconductor element on the mount area; electrically connecting element electrodes of the plurality of first semiconductor electrodes to the pair of first external electrodes by bonding wires that bridge across at least one of the pair of second external electrodes or the wiring electrically connected to the pair of second external electrodes; and forming a frame around the mount area such that at least a part of the frame is interposed between the bonding wires and at least one of the pair of the second external electrodes or the wiring electrically connected to the pair of second external electrodes.

The manufacturing method of the present invention will be described below with reference to FIG. 1. However, FIG. 1 illustrates merely an example that employs relay wirings as the wiring electrically connected to the pair of second external electrodes, and the manufacturing method of the present invention is not limited thereto.

(Substrate Preparing Step)

This step is to prepare the substrate 1 that is provided with a mount area 1a, a pair of first external electrodes 4 and 5 and a pair of second external electrodes 6 and 7 on the surface thereof. The first external electrodes and the second external electrodes are formed by electroless plating. The first external electrodes are formed along the periphery of the mount area at an outer side of the relay wirings that serves as the wiring electrically connected to the pair of the second external electrodes.

(Semiconductor Elements Mounting Step)

In this step, as the semiconductor elements, light emitting elements 2 and 3 are arranged and mounted on the mount area 1a of the substrate 1 at predetermined intervals in a predetermined pattern. When mounting, the bottom faces of the light emitting elements 2 are joined to the mount area 1a by a joining member. Further, the back-face electrodes of the light emitting elements 3 are joined on the second external electrode 7 and the relay wirings 8a, 8b and 8c. Further, the protection element 13 is mounted on the first external electrode 4 at a predetermined position. Depending on the joining member, the substrate 1 may be heated to cure or melt the joining member to paste and fix the light emitting elements 2 and 3 and the protection element after they are all mounted. The joining member may be provided either on the mount area at the part for mounting the light emitting elements 2 and 3 or on the light emitting elements 2 and 3, since it has only to be interposed between the mount area 1a and the light emitting elements 2 and 3. Alternatively, the joining member may be provided on both of them.

(Wire Bonding Step)

In this step, after the mounting step, the terminal electrodes at the upper parts of the light emitting elements 2 are electrically connected to the pair of the first external electrodes 4 and 5 by bonding wires. Similarly, the terminal electrodes on the upper part of the light emitting elements 3 are electrically connected to the pair of the second external electrodes 6 and 7 by bonding wires. The bonding wires may be connected by any method, such as normal methods known in the art.

(Frame Forming Step)

In this step, after the wire bonding step, a frame 10 is formed around the mount area 1a such that a part of the frame 10 is interposed between the bonding wires electrically connecting the electrodes of the light emitting elements 2 and the extensions of the first external electrodes and the relay wirings of the second external electrodes. The frame 10 may be formed, for example, by using a resin dispenser that can move (is movable) over the fixed substrate 1 in the height and horizontal directions with respect to the substrate 1. That is, a light reflective resin is formed in the vicinity of the light emitting elements by operating a resin dispenser filled with resin to move around with ejecting the liquid resin from its nozzle at the tip. The moving speed of the resin dispenser may be suitably set according to the viscosity, temperature and the like of the resin used. To make a plurality of formed light reflective resins having approximately the same width, it is preferred to move the dispenser at a constant speed at least while ejecting the resin. If the resin ejection is stopped while moving for example, the moving speed may be changed during the break. It is also preferred that the resin is ejected at a constant rate. Further, it is preferred that both of the moving speed and resin ejection rate of the resin dispenser are constant. The ejection rate can be adjusted, for example, by maintaining the ejecting pressure at a constant value.

(Sealing Member Filling Step)

This step is to fill the inside of the frame 10 with the sealing resin 11 so as to cover the light emitting elements 2 and 3 and the bonding wires. That is, the sealing member 11 for covering the light emitting elements, protection element, bonding wires and the like is formed by injecting molten resin to the inside of the frame 10 on the substrate 1, and thereafter curing the resin by means of heat, photoirradiation or the like.

While the embodiments of the present invention have been described, the present invention is not limited to those embodiments, and modifications may be made in the embodiments without departing from the spirit and scope of the present invention. That is, the structure of the above-mentioned light emitting device is merely intended to exemplify a light emitting device that embodies the technical idea of the present invention, and is not intended to limit the present invention thereto.

DESCRIPTION OF THE REFERENCE NUMERALS

1 Substrate
2 First semiconductor element
3 Second semiconductor element
4, 5 A pair of positive and negative first external electrodes
4a, 5a Terminals of the first external electrodes
4b, 5b Extensions of the first external electrodes
6, 7 A pair of positive and negative second external electrodes
6a, 7a Terminals of the second external electrodes
6b, 7b Extensions of the second external electrodes
8a, 8b, 8c Relay wirings
9 Bonding wire
10 Frame
11 Sealing member
12 Anode mark
13 Protection element
14 Thermistor
20 Light emitting face
100 Light emitting device

What is claimed is:

1. A semiconductor device, comprising:
a substrate;
a plurality of first semiconductor elements and a plurality of second semiconductor elements located on a rectangular mount area of the substrate;
a plurality of external electrodes located on the substrate and configured to supply electricity to the first and second semiconductor elements; and
a frame located at a periphery of the mount area, the frame comprising a reflective material,
wherein the external electrodes comprise:
a pair of positive and negative first external electrodes electrically connected to the plurality of first semiconductor elements, and
a pair of positive and negative second external electrodes electrically connected to the plurality of second semiconductor elements,
wherein the pair of first external electrodes are located along the periphery of the mount area at an outer side of a portion of the pair of the second external electrodes, and/or a portion of a wiring electrically connected to the pair of second external electrodes,
wherein electrodes of the plurality of first semiconductor elements are electrically connected to the pair of first external electrodes by a bonding wire that bridges across the portion of the pair of the second external electrodes, and/or the portion of the wiring electrically connected to the pair of second external electrodes,
wherein a part of the frame is interposed between (i) the bonding wire, and (ii) the portion of the pair of the second external electrodes, and/or the portion of the wiring electrically connected to the pair of second external electrodes,
wherein four of the second semiconductor elements are mounted at four respective corners of the mount area, and the first semiconductor elements are mounted in a remainder of the mount area,
wherein each of the first semiconductor elements includes a positive electrode and a negative electrode on a face opposite to a mount face thereof, and each of the second semiconductor elements mounted at the four corners of the mount area includes either a positive electrode or a negative electrode on a mount face thereof, and
wherein a total area of the plurality of first semiconductor elements is larger than a total area of the plurality of second semiconductor elements in plan view, and an individual area of each of the plurality of first semiconductor elements is smaller than an individual area of each of the plurality of second semiconductor elements in plan view.

2. The semiconductor device according to claim 1, wherein the semiconductor device comprises the wiring electrically connected to the pair of second external electrodes, and
wherein the wiring electrically connected to the pair of second external electrodes comprises at least one relay wiring connected to the plurality of second semiconductor elements.

3. The semiconductor device according to claim 2, wherein the pair of positive and negative second external electrodes and the at least one relay wiring are formed around the mount area.

4. The semiconductor device according to claim 1, further comprising a sealing member that fills an inside of the frame so as to cover the plurality of first semiconductor elements and the plurality of second semiconductor elements.

5. The semiconductor device according to claim 1, wherein the plurality of first semiconductor elements are a plurality of first light emitting elements, the plurality of first light emitting elements are divided into a plurality of groups of first light emitting elements, the first light emitting elements in each group being connected in series, and the groups being connected to the first external electrodes in parallel.

6. The semiconductor device according to claim 5, where each group of the first light emitting elements includes the same number of first light emitting elements.

7. The semiconductor device according to claim 1, further comprising a protection element configured to protect at least one of the plurality of first semiconductor elements and the plurality of second semiconductor elements from application of excessive voltage, the protection element being covered by the frame.

8. The semiconductor device according to claim 1, further comprising a thermistor located at an outer side of the frame.

9. The semiconductor device according to claim 1, wherein the plurality of second semiconductor elements are different type than the plurality of first semiconductor elements.

10. The semiconductor device according to claim 1,
wherein each of the plurality of first semiconductor elements and the plurality of second semiconductor elements has a rectangular shape in plain view,
wherein the mount area has a rectangular shape with a pair of first and third sides opposing each other and a pair of second and fourth sides opposing each other in plain view,
wherein a first diagonal of each of the first semiconductor elements is parallel to the first and third sides of the mount area, and a second diagonal of each of the first semiconductor elements is parallel to the second and fourth sides of the mount area, and
wherein a first diagonal of each of the second semiconductor elements is transverse to the first and third sides of the mount area, and a second diagonal of each of the second semiconductor elements is transverse to the second and fourth sides of the mount area.

11. A method for manufacturing the semiconductor device according to claim 1, comprising the steps of:
preparing the substrate on which the mount area, the pair of positive and negative first external electrodes and the pair of second positive and negative external electrodes are formed, wherein the pair of first external electrodes are formed along the periphery of the mount area at an outer side of a portion of the pair of the second external electrodes, and/or a portion of the wiring connected to the pair of second external electrodes;
mounting the plurality of first semiconductor elements and the plurality of second semiconductor elements on the mount area;
electrically connecting element electrodes of the first semiconductor elements to the pair of first external electrodes by the bonding wire that bridges across the portion of the pair of second external electrodes, and/or the portion of the wiring connected to the pair of second external electrodes; and
forming the frame around the mount area such that a part of the frame is interposed between (i) the bonding wire, and (ii) the portion of the pair of the second external electrodes, and/or the portion of the wiring connected to the pair of second external electrodes,
wherein, in the step of mounting the plurality of first semiconductor elements and the plurality of second semiconductor elements, four of the second semiconductor elements are mounted at four respective corners of the mount area, and the first semiconductor elements are mounted in a remainder of the mount area, and
wherein the total area of the plurality of first semiconductor elements is larger than a total area of the plurality of second semiconductor elements in plain view, and an individual area of each of the plurality of first semiconductor elements is smaller an individual area of each of the plurality of second semiconductor elements in plain view.

12. A semiconductor device, comprising:
a substrate;
a plurality of first semiconductor elements and a plurality of second semiconductor elements located on a rectangular mount area of the substrate;
a plurality of external electrodes located on the substrate and configured to supply electricity to the first and second semiconductor elements; and
a frame located at a periphery of the mount area, the frame comprising a reflective material,
wherein the external electrodes comprise:
a pair of positive and negative first external electrodes electrically connected to the plurality of first semiconductor elements, and
a pair of positive and negative second external electrodes electrically connected to the plurality of second semiconductor elements,
wherein the pair of first external electrodes and the pair of the second external electrodes each comprises a terminal configured to be connected to an external electrode and an extension extending from the terminal along the periphery of the mount area,
wherein the semiconductor device further comprises a plurality of wirings located on the substrate along ones of the extensions of the pair of the first external electrodes,
wherein the extensions of the pair of first external electrodes and pair of second external electrodes and the plurality of wirings are covered with the frame,
wherein at least one of the second external electrodes and/or at least one of the wirings has portions located at both an inner side and an outer side of an inner periphery of the frame,
wherein four of the second semiconductor elements are mounted at four respective corners of the mount area, and the first semiconductor elements are mounted in a remainder of the mount area,
wherein each of the first semiconductor elements includes a positive electrode and a negative electrode on a face opposite to a mount face thereof, and each of the second semiconductor elements mounted at the four corners of the mount area includes either a positive electrode or a negative electrode on a mount face thereof, and
wherein a total area of the plurality of first semiconductor elements is larger than a total area of the plurality of second semiconductor elements in plan view, and an individual area of each of the plurality of first semiconductor elements is smaller than an individual area of each of the plurality of second semiconductor elements in plan view.

13. The semiconductor device according to claim 12, wherein the extensions of the pair of first external electrodes are formed at an outer side of the plurality of wirings, and electrodes of the plurality of first semiconductor elements are connected to the extensions of the pair of first external electrodes by a bonding wire that bridges across a portion of at least one of the wirings.

14. The semiconductor device according to claim 13, wherein a part of the frame is interposed between the bonding wire and the plurality of wirings.

15. The semiconductor device according to claim 12, wherein each of the plurality of wirings electrically connected to the pair of second external electrodes comprises at least one relay wiring connected to the plurality of second semiconductor elements.

16. The semiconductor device according to claim 15, wherein the pair of positive and negative second external electrodes and the at least one relay wiring are formed around the mount area.

17. The semiconductor device according to claim 12, further comprising a sealing member that fills an inside of the frame so as to cover the plurality of first semiconductor elements and the plurality of second semiconductor elements.

18. The semiconductor device according to claim 17, wherein the sealing member contains a phosphor.

19. The semiconductor device according to claim 12, wherein the extensions of the pair of first external electrodes are formed at an inner side of the plurality of wirings, and an electrode of the plurality of second semiconductor elements is connected to the plurality of wirings by a bonding wire that bridges across a portion of at least one of the extensions of the pair of first external electrodes.

20. The semiconductor device according to claim 12, further comprising a phosphor that is located apart from the plurality of first semiconductor elements and the plurality of second semiconductor elements.

21. The semiconductor device according to claim 12, further comprising a thermal sensor mounted on the substrate.

22. The semiconductor device according to claim 12, wherein the plurality of second semiconductor elements are different type than the plurality of first semiconductor elements.

23. The semiconductor device according to claim 12,
wherein each of the plurality of first semiconductor elements and the plurality of second semiconductor elements has a rectangular shape in plain view,
wherein the mount area has a rectangular shape with a pair of first and third sides opposing each other and a pair of second and fourth sides opposing each other in plain view,
wherein a first diagonal of each of the first semiconductor elements is parallel to the first and third sides of the mount area, and a second diagonal of each of the first semiconductor elements is parallel to the second and fourth sides of the mount area, and
wherein a first diagonal of each of the second semiconductor elements is transverse to the first and third sides of the mount area, and a second diagonal of each of the second semiconductor elements is transverse to the second and fourth sides of the mount area.

24. A semiconductor device, comprising:
a substrate;
a plurality of first semiconductor elements and a plurality of second semiconductor elements located on a rectangular mount area of the substrate;
a plurality of pairs of external electrodes located on the substrate and configured to supply electricity to the first and second semiconductor elements;
a plurality of wirings formed on the substrate; and
a frame located at a periphery of the mount area, the frame comprising a reflective material,
wherein at least one of the first or second semiconductor elements is mounted on at least one of the external electrodes,
wherein the at least one external electrode on which the at least one first or second semiconductor element is mounted and/or at least one wiring has portions located at both an inner side and an outer side of an inner periphery of the frame
wherein four of the second semiconductor elements are mounted at four respective corners of the mount area, and the first semiconductor elements are mounted in a remainder of the mount area,
wherein each of the first semiconductor elements includes a positive electrode and a negative electrode on a face opposite to a mount face thereof, and each of the second semiconductor elements mounted at the four corners of the mount area includes either a positive electrode or a negative electrode on a mount face thereof, and
wherein a total area of the plurality of first semiconductor elements is larger than a total area of the plurality of second semiconductor elements in plan view, and an individual area of each of the plurality of first semiconductor elements is smaller than an individual area of each of the plurality of second semiconductor elements in plan view.

25. The semiconductor device according to claim 24, wherein the semiconductor device comprises the wiring electrically connected to the pair of second external electrodes, and wherein the wiring electrically connected to the pair of second external electrodes comprises at least one relay wiring connected to the plurality of second semiconductor elements.

26. The semiconductor device according to claim 25, wherein the pair of positive and negative second external electrodes and the at least one relay wiring are formed around the mount area.

27. The semiconductor device according to claim 24,
wherein each of the plurality of first semiconductor elements and the plurality of second semiconductor elements has a rectangular shape in plain view,
wherein the mount area has a rectangular shape with a pair of first and third sides opposing each other and a pair of second and fourth sides opposing each other in plain view,
wherein a first diagonal of each of the first semiconductor elements is parallel to the first and third sides of the mount area, and a second diagonal of each of the first semiconductor elements is parallel to the second and fourth sides of the mount area, and
wherein a first diagonal of each of the second semiconductor elements is transverse to the first and third sides of the mount area, and a second diagonal of each of the second semiconductor elements is transverse to the second and fourth sides of the mount area.

* * * * *

UNITED STATES PATENT AND TRADEMARK OFFICE
CERTIFICATE OF CORRECTION

PATENT NO. : 9,768,228 B2  
APPLICATION NO. : 14/140352  
DATED : September 19, 2017  
INVENTOR(S) : Yuta Oka Page 1 of 1

It is certified that error appears in the above-identified patent and that said Letters Patent is hereby corrected as shown below:

In the Claims

Column 17, Line 19:
Please replace "plain view," with --plan view,--.

Column 17, Lines 22-23:
Please replace "plain view," with --plan view,--.

Column 17, Lines 66-67:
Please replace "plain view," with --plan view,--.

Column 18, Line 3:
Please replace "plain view." with --plan view.--.

Signed and Sealed this
Second Day of January, 2018

Joseph Matal
*Performing the Functions and Duties of the*
*Under Secretary of Commerce for Intellectual Property and*
*Director of the United States Patent and Trademark Office*